United States Patent [19]

Wakamatsu

[11] Patent Number: 5,345,182

[45] Date of Patent: Sep. 6, 1994

[54] IMPEDANCE METER CAPABLE OF PERFORMING MEASUREMENTS AT HIGH PRECISION OVER WIDE IMPEDANCE AND FREQUENCY RANGES

[75] Inventor: Hideki Wakamatsu, Kobeshi, Japan

[73] Assignee: Hewlett-Packard Company, Palo Alto, Calif.

[21] Appl. No.: 965,795

[22] Filed: Oct. 23, 1992

[30] Foreign Application Priority Data

Oct. 31, 1991 [JP] Japan .................. 3-313898

[51] Int. Cl.$^5$ .................. G01R 27/08; G01R 27/16
[52] U.S. Cl. .................. 324/649; 324/654; 324/713; 324/522
[58] Field of Search .................. 324/638, 648, 649, 654, 324/658, 691, 713, 715, 115, 522

[56] References Cited

U.S. PATENT DOCUMENTS

| | | | |
|---|---|---|---|
| 3,800,218 | 3/1974 | Shekel | 324/648 X |
| 4,467,275 | 8/1984 | Maeda et al. | 324/713 |

FOREIGN PATENT DOCUMENTS

| | | | |
|---|---|---|---|
| 58-53767 | 3/1983 | Japan | 324/649 |
| 2220756 | 1/1990 | United Kingdom | 324/654 |

OTHER PUBLICATIONS

Hewlett-Packard Operation and Service Manual for "Model 4191A-RF Impedance Analyzer," Yokogawa-Hewlett-Packard, Ltd., 1980, pp. 8-6-8-7.
Hewlett-Packard Operation and Service Manual for "Model 4193A-Vector Impedance Meter," Yokogawa-Hewlett-Packard, Ltd., 1981, pp. 8-2-8-3.

*Primary Examiner*—Gerard R. Strecker
*Assistant Examiner*—Diep Do

[57] ABSTRACT

A system for measuring a broad range of impedance values with high precision and over a broad frequency band. Both the broadrange impedance measurement capability of the V-I method and the broadband frequency measuring capability of the reflection coefficient method are provided. A remote measurement capability is also available. Based upon the V-I method, a selection is made between a circuit to achieve an ideal open and a circuit to achieve an ideal short circuit in response to the impedance values. A boundary for selecting the impedance is, for instance, 50Ω. To measure a high impedance, the ideal open type circuit is selected; to measure a low impedance, the ideal short circuit is selected. The source and measuring instruments are extended by a coaxial cable. A floating measuring instrument is obtained by using a balun. Impedance measurements for 1 MHz to 2 GHz are possible.

19 Claims, 11 Drawing Sheets

IMPEDANCE METER CAPABLE OF PERFORMING MEASUREMENTS AT HIGH PRECISION OVER WIDE IMPEDANCE AND FREQUENCY RANGES

FIELD OF THE INVENTION

The present invention generally relates to impedance measuring methods and apparatus, and more particularly relates to an impedance meter capable of performing measurements at high precision over wide impedance and broadband frequency ranges, and of performing remote measurements. It should be noted that in this specification the term impedance encompasses a resistance value, capacitance value, inductance value, reactance value and the like.

BACKGROUND OF THE INVENTION

FIG. 1 depicts a model of an impedance measuring system. A signal source E, a device under test (DUT) $Z_X$, and measuring instruments M1, M2 are connected to an intermediating network (transducer TRD). The DUT's impedance is determined by a function (bilinear transformation) of two measured values (e.g., complex voltages or currents) at internal points of the TRD. The difference between impedance measurement by the conventional reflection coefficient and voltmeter/ammeter (V-I) methods is merely in the TRD network and the two measuring points. That is, the difference is in the coefficients of the following bilinear transformation formula:

$$Z_X = a(1+br)/(1+cr) \quad (1)$$

where $r = V_1/V_2$ ($V_1$ and $V_2$ indicate values measured by the measuring instruments M1 and M2, respectively). Symbols a, b, c are coefficients determined by the type of transducer, and are based on a ratio of measured values when the connection end to be connected with $Z_X$ (measurement port) is connected to a short circuit, open circuit, and 50Ω load, respectively. The type of network used for the TRD is determined in accordance with the desired impedance measurement range and the desired measurement frequency range.

FIG. 2 is a schematic diagram of a high-frequency impedance measuring apparatus in accordance with the model of FIG. 1. A signal source is connected to the TRD, and measuring instruments $V_1$, $V_2$ are connected to the TRD by extension coaxial cables having a characteristic impedance $Z_0$ ($Z_0 = R_0$). Signal regulators adjust the relationship between the input signal and the full-scale outputs of the measuring instruments (ranging action).

Temperature stability and measurement S/N are factors that adversely influence measuring performance. In the FIG. 2 apparatus, temperature stability is affected by the temperature sensitivity of the TRD network and the complex gain of the measuring instrument. The gain variation of the measuring instrument is mainly caused by the transmission gain change of the extension cable and the gain change of the voltmeter. The measurement S/N is affected by instrument S/N. If the signal regulator is properly set, the instrument S/N is obtained as a dynamic range of the voltmeter, i.e., a ratio of a full-scale value to a zero-point error (noise or offset).

The measurement performance of a conventional high-frequency impedance measuring apparatus will now be considered. FIG. 3 is a schematic diagram for explaining the reflection coefficient measuring method. Commercially available impedance meters having a 1 MHz to 1 GHz frequency range employ this method. A resistor bridge 1 is employed as a transducer, or TRD, a voltage of a signal source corresponding to an input voltage is measured, and an unbalance voltage of the bridge corresponding to the reflection voltage is measured. The impedance of the DUT is calculated by using the ratio of the reflection and input voltages (reflection coefficient). The signal source 3, measuring instruments 4, 5 and bridge 1 are connected with coaxial cables 2 (measuring instrument extension cables).

The unknown impedance $Z_x$ is expressed by the following equations:

$$Z_x = a(1+br)/(1+cr) \quad (a = R_0, b = 1, c = -1)$$

$$Z_x = R_0(1+r)/(1-r),$$

$$r \text{ (reflection coefficient)} = 8 \, V_r/V_i$$

A detailed circuit is described in Japanese Patent Publication No. 64-1748.

FIG. 5 depicts a characteristic relationship between values of $Z_x$ and an error expansion ratio associated with this measuring method. The error expansion ratio equals a $Z_x$ measuring error (%) divided by an error of the measuring instrument (for example, the measuring instrument 4, 5) (%). Assuming now that the abscissa of this graph indicates the values of $Z_x$, and the ordinate logarithm thereof represents unbalance voltages of the bridge, the relationship between the unbalance voltages and $Z_x$ is represented as a solid line "a" based upon the above equation. The measuring apparatus pre-stores the solid line "a" and determines $Z_x$ on the basis of the measured unbalance voltage. Considering now the "temperature stability", it is assumed that the solid line "a" is changed to a dotted line "b" by variations in gains of the measuring device. Measurement error occurs since the values of $Z_x$ in solid line "a" are different from the values of $Z_x$ in dotted line "b", even if the unbalance voltages are the same.

It should be noted that, when a DUT having a real resistance value of 50Ω is measured and if the temperature stability of the bridge (TRD) itself is improved, variations in the gain of the measuring instruments cause a small variation in the measured values of the impedance. That is because the unbalance voltage of the bridge represents a shift from 50Ω, and this unbalance voltage is very small when the DUT impedance is near 50Ω. However, as shown in FIG. 5, the temperature coefficient of the gains of the measuring instrument is greatly expanded during a measurement of a DUT impedance other than the characteristic impedance. For instance, with respect to the measurements of 500Ω or 5Ω, the gain variation in the measuring instrument is expanded 10 times (a ratio of 500Ω to 50Ω), which may cause changes in the measured values. In other words, a variation of 1% in the gains of the measuring instrument may cause an error of 10% in the measurement.

The "measured S/N" is similar to the case of the above-described measurement. If the measuring instrument includes a signal regulator, then the instrument S/N remains constant, independent of the DUT impedance. However, the measured S/N is considerably deteriorated when the DUT impedance is not 50Ω. It should be noted that there is no difference in the DUT measurement errors caused by variations in the cable characteristics and the gains of the measuring instrument; this holds even when the cable at the measuring port side of the TRD is extended and the cable at the measuring instrument side is extended.

FIG. 4 is a schematic diagram of a conventional voltmeter/ammeter (V-I) measuring apparatus. V-I impedance meters having a frequency range of up to 100 MHz are commercially available. The signal source 3, measuring instruments 4, 5 and DUT ($Z_x$) are connected to each other via coaxial cables 2, and the current flowing through the DUT is detected by the measuring instrument 4 via a current transformer 6 having a winding ratio of 1:N, which floats a current measuring point. That is, the current flowing through the DUT is measured by the current transformer 6 as a first measured value, and a voltage across the DUT, which also includes a voltage drop across the current transformer, is measured as a second measured value. The impedance of the DUT is calculated from a ratio of these two measured values. An unknown impedance $Z_x$ is calculated with the following formula:

$Z_x = a(1+br)/(1+cr)$  $(ab=R_0, b=\infty, c=0)$ $Z_x R_0 \cdot r$, $r = V_v/V_i$ Considering temperature stability, if both a voltage and a current produced in the DUT can be measured under an ideal condition (which is described below), the temperature coefficient of the gains in the measuring instrument will not be expanded. Any changes in the gains of the measuring instrument appear as changes in measured impedance values with a 1:1 relationship, approximately. For instance, a variation of 1% in the gains of the measuring instrument may cause approximately 1% error in the measured values. This condition is shown in FIG. 6. Similar to the measured S/N, if the measuring instrument includes a signal regulator, a ratio of the measured S/N to the instrument S/N corresponds to about 1:1, and does not depend upon the DUT impedance.

It should be understood that, in the V-I method, there is a difference between the influences on the measurement errors due to the changes in the cable characteristics and changes in the gains of the measuring instruments in a case where the cable is extended at the measuring port side via the TRD and in a case where the cable is extended at the measuring instrument side. The cable extension at the measuring instrument maintains the error expansion ratio shown in FIG. 6, whereas the measurement error other than the characteristic impedance of the cable may be greatly enlarged by the cable extension at the side of the measuring port. This may be considered since an "ideal open" and "ideal short circuit" are difficult to realize (these ideal circuits are described below). As a consequence, since the extension of the measuring port reduces the merit of the V-I method, the cable extension is usually performed at the measuring instrument side.

The above mentioned "ideal" condition implies that the conditions $V_i=0$ (measured current value 0, measured voltage value = finite value) and $V_v=0$ (measured voltage value = 0, measured current value = finite value) are simultaneously satisfied with the DUT under open and short circuit conditions. It is impossible to satisfy these conditions by employing two measuring instruments having finite input impedances. They can only be satisfied if at least one of the two measuring instruments can provide input impedances from zero to an infinite value.

FIG. 7 is a schematic diagram of "a circuit to achieve an ideal open measurement," and FIG. 8 is a schematic diagram of "a circuit to achieve an ideal short circuit measurement." Reference numeral 10 denotes a signal source; reference numeral 12 denotes a voltmeter; and reference numeral 14 denotes an ammeter. In the non-ideal V-I method by which the ideal open measurement and the ideal short circuit measurement cannot be obtained, variations in the gain of the measuring instrument cause influences on the measured impedance values; these influences may be effected while maintaining the error expansion ratio similar to the above-described reflection coefficient method, depending upon the degrees. In other words, in a circuit where the ideal open condition can be achieved and the ideal short circuit condition cannot be achieved, the error expansion ratio becomes large in the low impedance region, whereas in a circuit where the ideal short circuit condition can be achieved and the ideal open condition cannot be achieved, the error expansion ratio becomes large in the high-impedance region.

In the circuit shown in FIG. 4, the circuit to achieve an ideal open measurement (FIG. 7) is used as the basic circuit. A current transformer 6 having a winding ratio of 1:10 is used to realize the circuit to achieve an ideal short circuit measurement. The current transformer 6 lowers the input impedance of the measuring instrument 4 for measuring the current (the input impedance is reduced by a factor of $1/N^2$). However, use of the current transformer presents the following drawbacks:

(a) The larger the winding ratio is increased to realize the ideal short circuit measurement, the smaller the signal derived from the TRD becomes (the signal is reduced by a factor of $1/N$). The measurement S/N for measuring the impedance of a high impedance DUT is reduced.

(b) It is difficult to construct a transformer with a broad frequency band. This item is discussed below in paragraphs c, d, e.

(c) It is difficult to set the primary/secondary coupling degree to a large value over a broad frequency band (this requires reducing the leakage reactance); it is also difficult to maintain a high exciting impedance. It is not possible to use a multi-winding-to-one transformer operated at 1 MHz, for instance, under 1 GHz, taking account of variations in the magnetic permeability, a leakage inductance of a secondary winding, and a distributed capacitance.

(d) If a transformer designed for low-frequency operation is used, the ideal open measurement value and the ideal short circuit measurement cannot be reduced to an expected small value in a high frequency region. This is because, when the core size of the transformer is increased, the primary residual inductance is increased and the capacitance between the primary winding and the core is increased.

(e) Since a value of the exciting impedance in the low frequency region is mainly dependent upon the magnetic permeability of the core, the temperature characteristic of the core may cause variations in the measurement gains and the primary residual impedances.

Now, let's consider the circuit to achieve the ideal open measurement and the circuit to achieve the ideal short circuit measurement from a different point of view. FIG. 9 is a general characteristic diagram of the circuit to achieve the ideal open measurement shown in FIG. 7. In this figure, the abscissa represents an impedance and the ordinate represents the logarithm of a measured value (with respect to a certain regulated value). In a region where the impedance is large, the variation in values of current (I, $V_i$) through the DUT is large. On the other hand, FIG. 10 is a general characteristic diagram of a circuit to achieve the ideal short circuit measurement. In this case, in a region where the impedance is small, a variation in values of voltage (V, $V_v$) across the DUT is large. Accordingly, if the circuit to achieve the ideal open measurement is employed during the high impedance measurement and the circuit to achieve the ideal short circuit measurement is utilized during the low impedance measurement, a measurement with high sensitivity can be achieved over a broad impedance range. FIGS. 9 and 10 are practically characteristic diagrams of a circuit shown in FIG. 19.

The merits and demerits of the reflection coefficient method and the V-I method will now be summarized.

The reflection coefficient method is suitable for measuring impedances near the characteristic impedance of the bridge (for example, 50Ω). However, the precision (stability, measurement S/N) of this method is greatly lowered when impedances other than 50Ω are measured over a wide impedance range, stable precision can be achieved with the V-I method. If the signal regulator is assembled into the measuring instrument, the measured S/N becomes stable. This method is remote-measurable. However, with the conventional V-I method, it is difficult to improve the measured S/N, simultaneously achieve the ideal open measurement as well as the ideal short circuit measurement, and also broaden the frequency range. Furthermore, it is rather difficult to expect the better temperature characteristic of the broadband current transformer employed in the conventional V-I method.

SUMMARY OF THE INVENTION

Accordingly, a major object of the present invention is to provide an impedance meter having both the broadband impedance measurement capability of the V-I method, and the broadband frequency measuring capability of the reflection coefficient method. A further object on the present invention is to provide a remote-measurable impedance meter.

An impedance meter in accordance with the present invention comprises a signal source comprising means for exciting a DUT; a first measuring instrument for measuring a first voltage indicative of a voltage drop across the DUT; a second measuring instrument for measuring a second voltage indicative of a current through the DUT; and switching means for switching an arrangement of the signal source and the first and second measuring instruments between an ideal open type circuit and an ideal short circuit type circuit in response to a DUT impedance determined on the basis on the first and second voltages.

In preferred embodiments of the present invention, a measuring port to which the DUT is connected, the signal source, and the first and second measuring instruments are connected with each other via coaxial cables having a characteristic impedance $Z_0$, and internal impedances of the signal source and the measuring instruments are approximately equal to $Z_0$.

Preferred embodiments of the invention may advantageously further comprise a balun associated with at least one of the coaxial cables. Further, in preferred embodiments the first measuring instrument comprises a voltmeter arranged to measure a voltage between an inner and an outer conductor of a first coaxial cable; the second measuring instrument comprises a voltmeter arranged to measure a voltage between an inner and an outer conductor of a second coaxial cable; and the signal source is arranged to apply a voltage across an inner and an outer conductor of a third coaxial cable. The first, second and third coaxial cables are adapted to be operatively coupled to the DUT.

In one preferred embodiment of the invention, the switching means comprises means for connecting the outer conductor of the first cable to the outer conductor of the third cable in response to a high DUT impedance, and for connecting the outer conductor of the first cable to a common potential in response to a low DUT impedance.

In a second preferred embodiment of the invention, the switching means comprises means for connecting the inner conductor of the first cable to the inner conductor of the third cable and outer conductor of the second cable in response to a high DUT impedance, and for connecting the inner conductor of the first cable to the inner conductor of the second cable in response to a low DUT impedance.

In a third preferred embodiment of the invention, the switching means comprises means for connecting the inner conductor of the second cable to the outer conductors of the first and third cables in response to a high DUT impedance, and for connecting the inner conductor of the second cable to the inner conductors of the first and third cables in response to a low DUT impedance.

In a fourth preferred embodiment of the invention, the switching means comprises means for connecting the outer conductor of the second cable to the inner conductor of the first cable in response to a high DUT impedance, and for connecting the outer conductor of the second cable to a common potential in response to a low DUT impedance.

In a fifth preferred embodiment of the invention, the switching means comprises means for selectively connecting the inner conductor of the first cable to the inner conductor of the third cable and the outer conductor of the second cable.

In another embodiment of the invention, the switching means comprises a diode switch.

In yet another embodiment of the invention, the balun, switching means and a tip of the coaxial cables are arranged within a single housing and are remote from the signal source and measuring instruments.

The present invention also encompasses methods for measuring an impedance of a DUT. Such methods in accordance with the invention comprise the steps of exciting a DUT with a signal source; measuring, with a first measuring instrument, a first voltage indicative of a voltage drop across said DUT; measuring, with a second measuring instrument, a second voltage indicative of a current through said DUT; determining a DUT impedance on the basis on said first and second voltages; and switching an arrangement of said signal source and said first and second measuring instruments between an ideal open type circuit and an ideal short circuit type circuit in response to the DUT impedance determined on the basis on said first and second voltages.

In accordance with the present invention, the above-described broadrange impedance measurement capability and broadband frequency measuring capability may be achieved by realizing the ideal open measurement and the ideal short circuit measurement, and by deleting the current transformer. The ideal open measurement and the ideal short circuit measurement are performed by selecting the circuit to achieve the ideal short circuit measurement during a low impedance measurement, and selecting the circuit to achieve the ideal open measurement during the high impedance measurement. The circuit is so arranged that both the impedance and the excitation voltage as viewed from DUT become constant, independent of the circuit selections.

The remote-measurement may be achieved in that the TRD portion is constructed with a small number of elements; in addition, the TRD portion is connected with the measurement portion by extended coaxial cables in the manner of the conventional V-I method. To measure a voltage and a current of a DUT, a balun (common mode choke) is utilized when a floating voltmeter and a floating ammeter are required. Other features of the invention are described below.

DETAILED DESCRIPTION OF PREFERRED EMBODIMENTS

Figure 1:
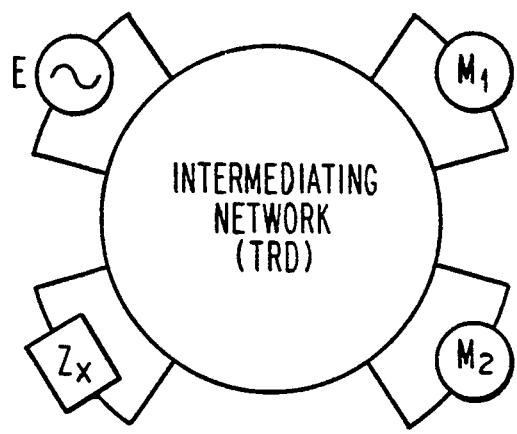
FIG. 1 is a model diagram of a generalized impedance measuring apparatus.
Figure 2:
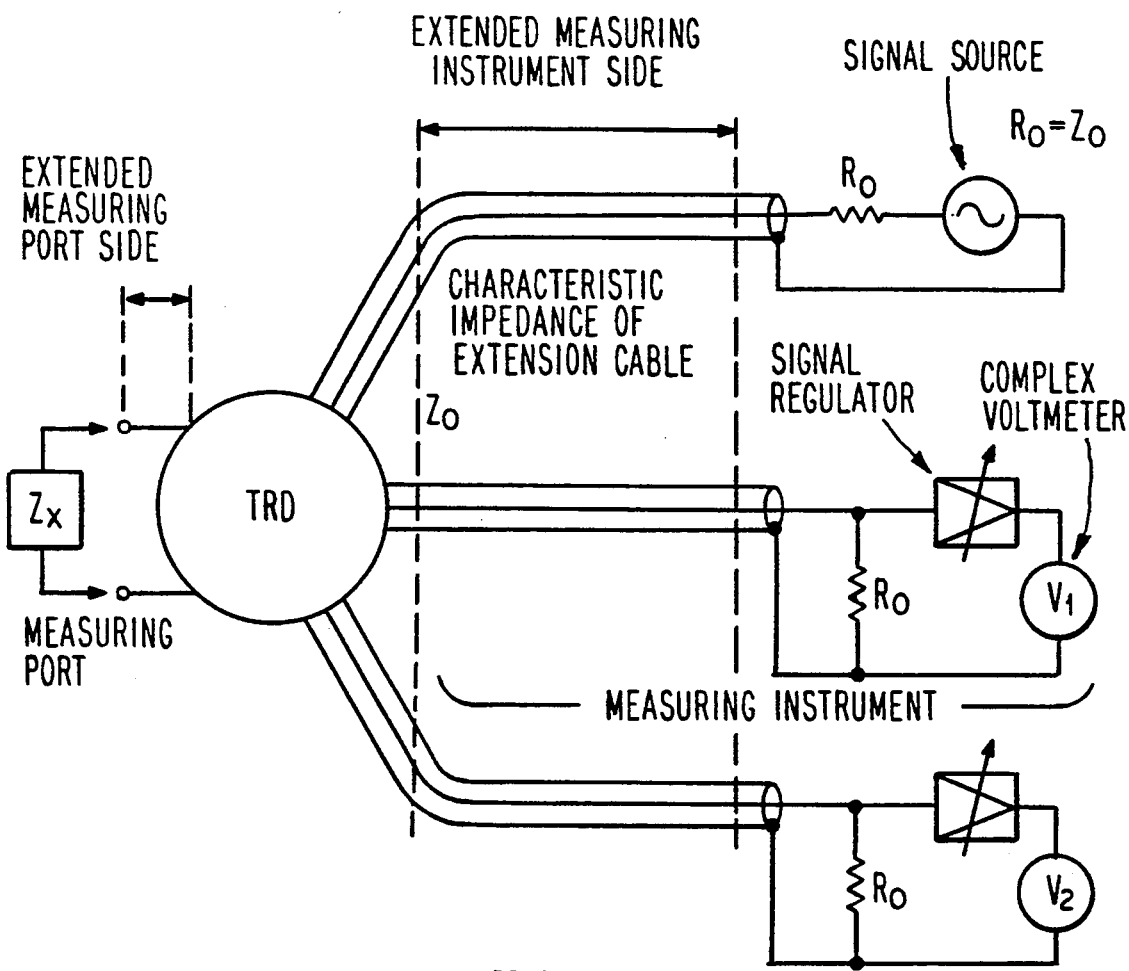
FIG. 2 is a model of a high-frequency impedance measuring instrument in accordance with the model of FIG. 1.
Figure 3:
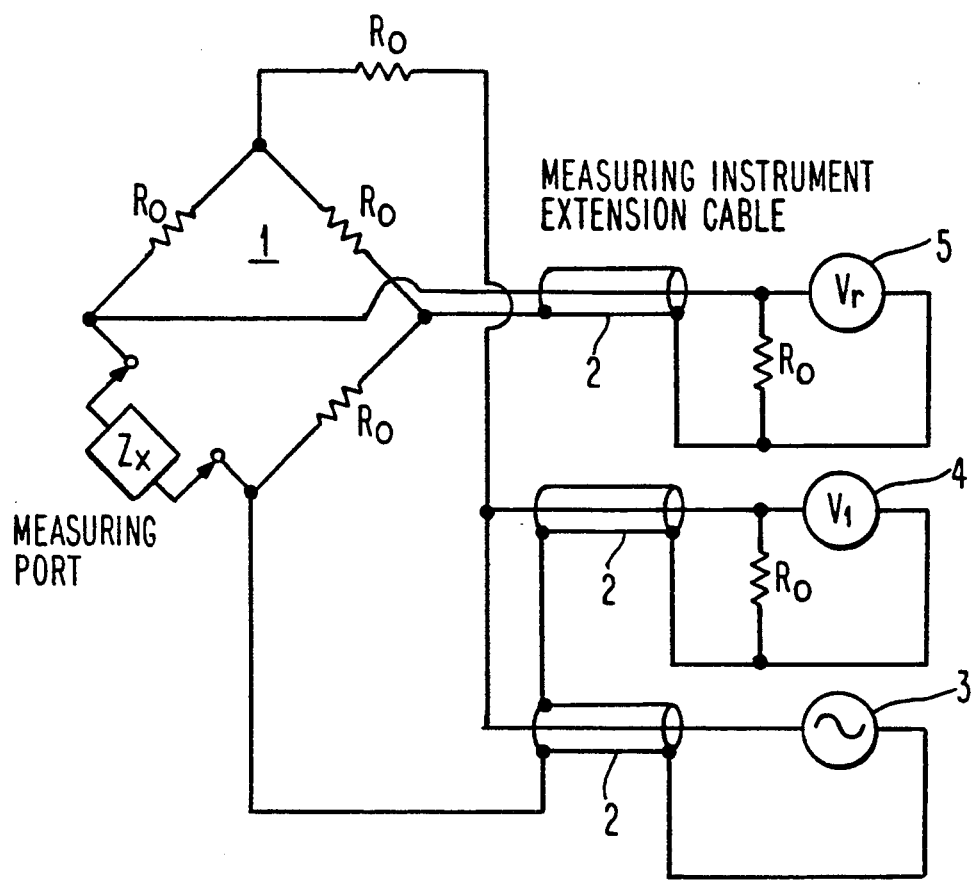
FIG. 3 is a schematic diagram of a conventional reflection coefficient measuring apparatus.
Figure 4:
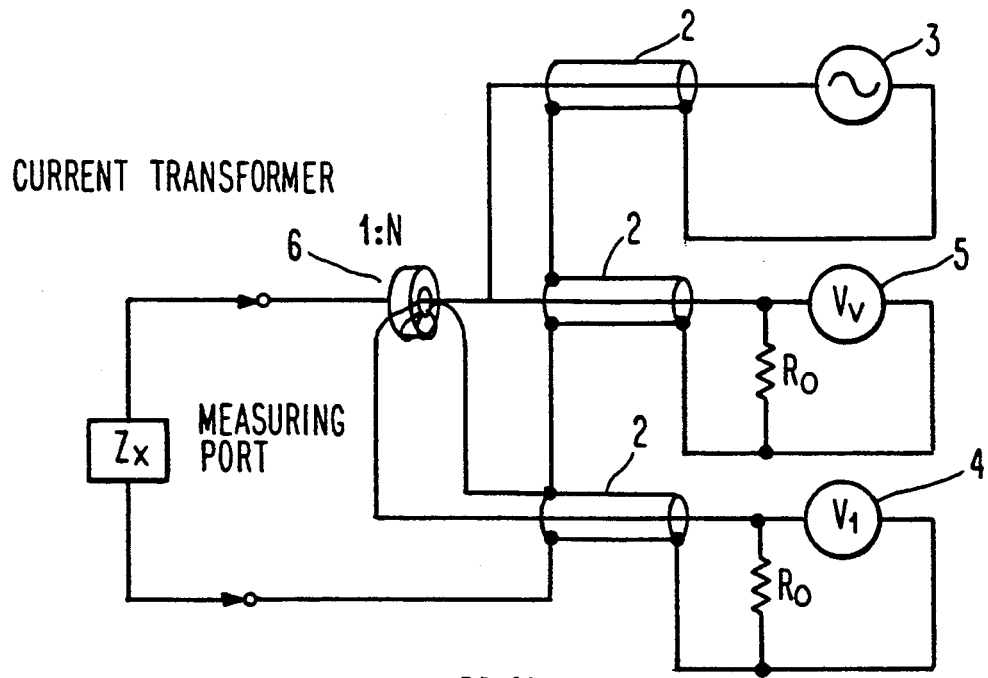
FIG. 4 is a schematic diagram of a conventional voltmeter/ammeter (V-I) measuring apparatus.
Figure 5:
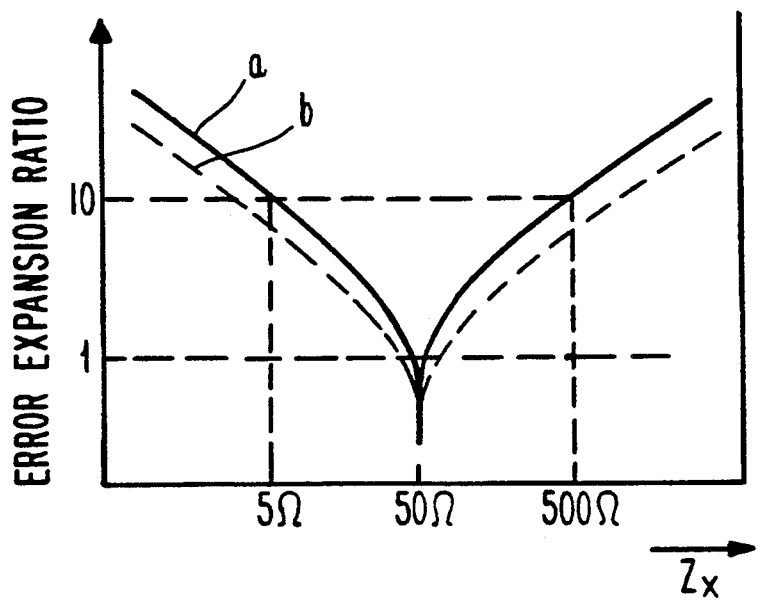
FIG. 5 is a characteristic diagram depicting a relationship between the value of $Z_x$ and the error expansion ratio associated with the reflection coefficient method.
Figure 6:
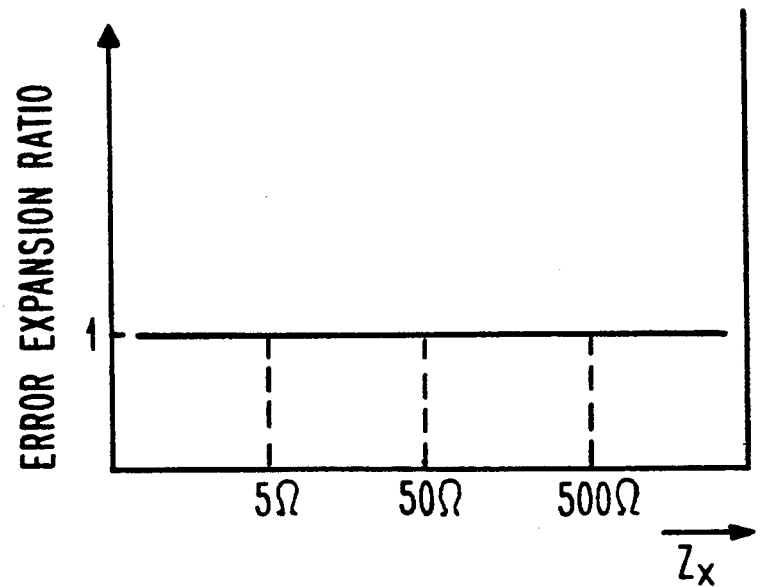
FIG. 6 is a characteristic diagram depicting a relationship between $Z_x$ and the error expansion ratio associated with the voltmeter/ammeter method.
Figure 7:
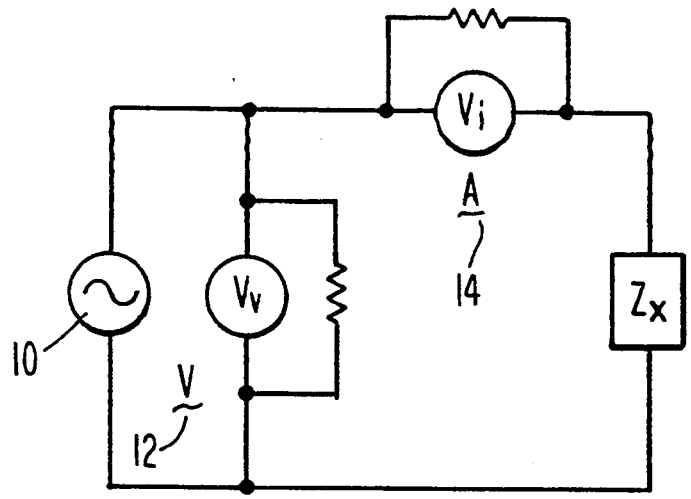
FIG. 7 is a schematic diagram of a circuit to achieve the ideal open measurement.
Figure 8:
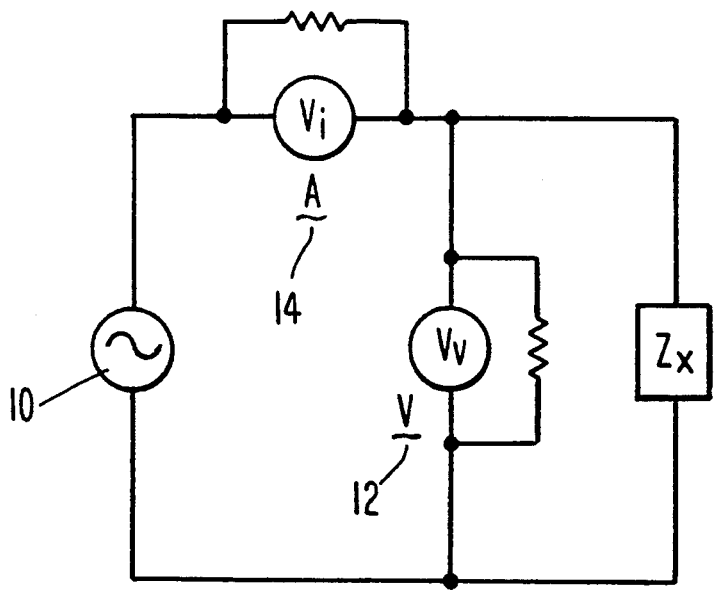
FIG. 8 is a schematic diagram of a circuit to achieve the ideal short circuit measurement.
Figure 9:
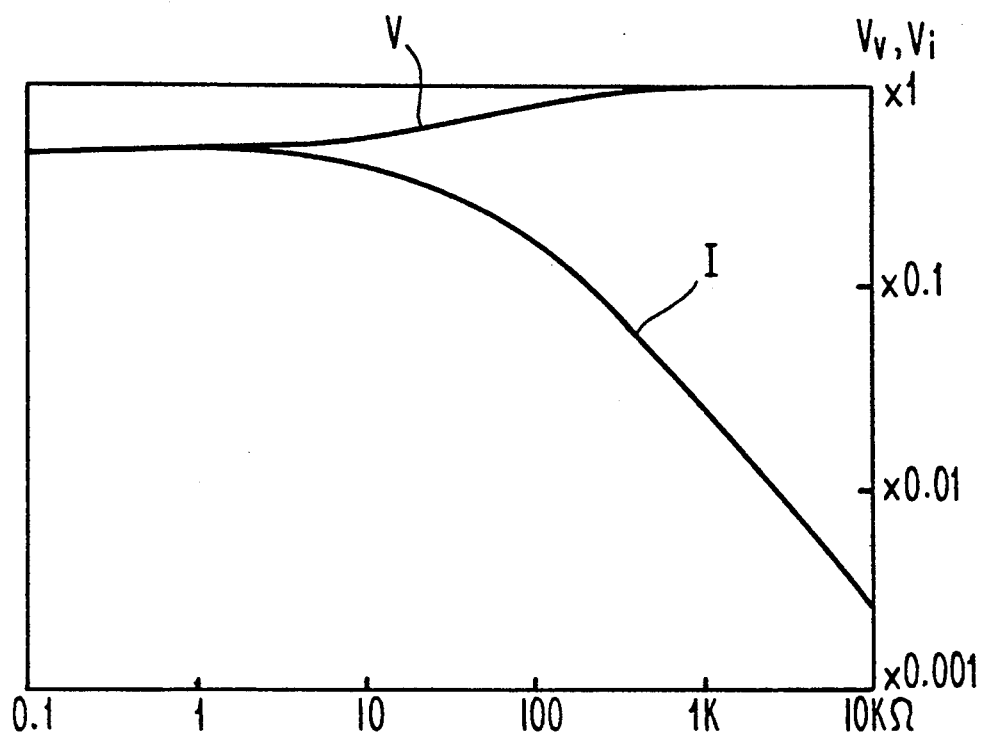
FIG. 9 is a characteristic diagram of the circuit to achieve the ideal open measurement.
Figure 10:
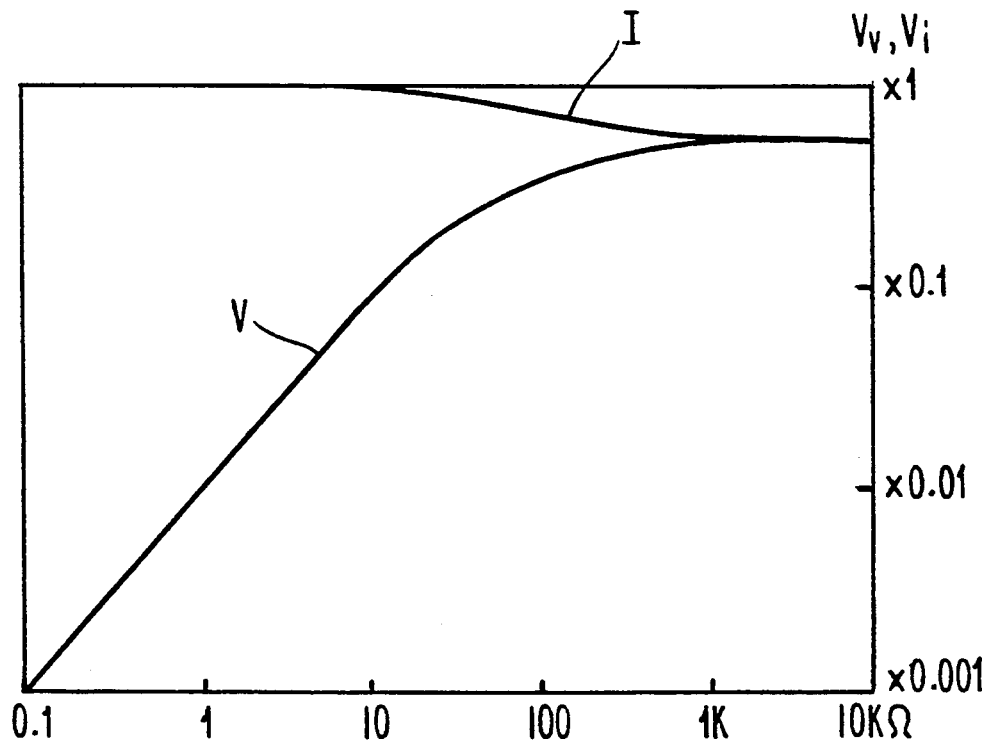
FIG. 10 is a characteristic diagram of the circuit to achieve the ideal short circuit measurement.
Figure 11:
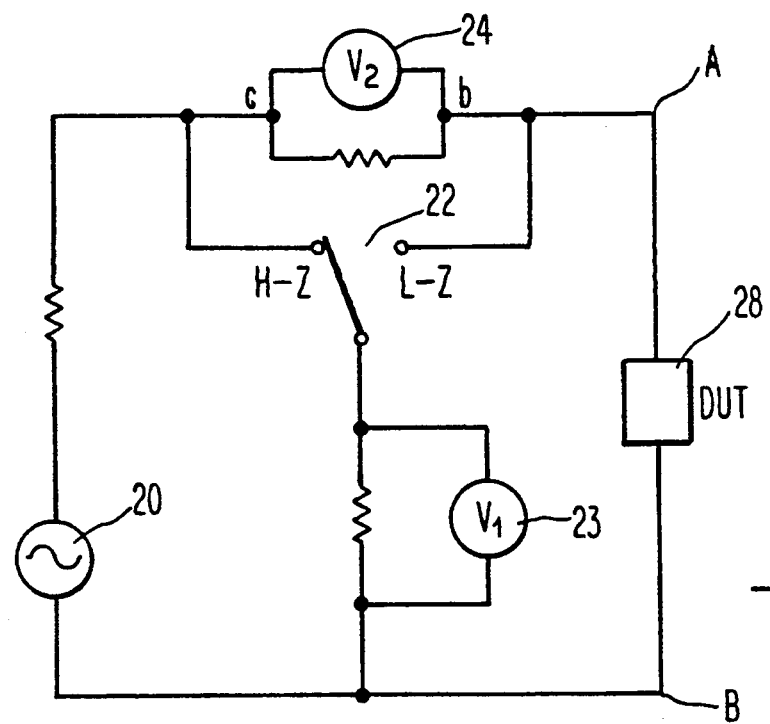
FIG. 11 is a first principle circuit diagram of an impedance meter in accordance with the present invention.
Figure 12:
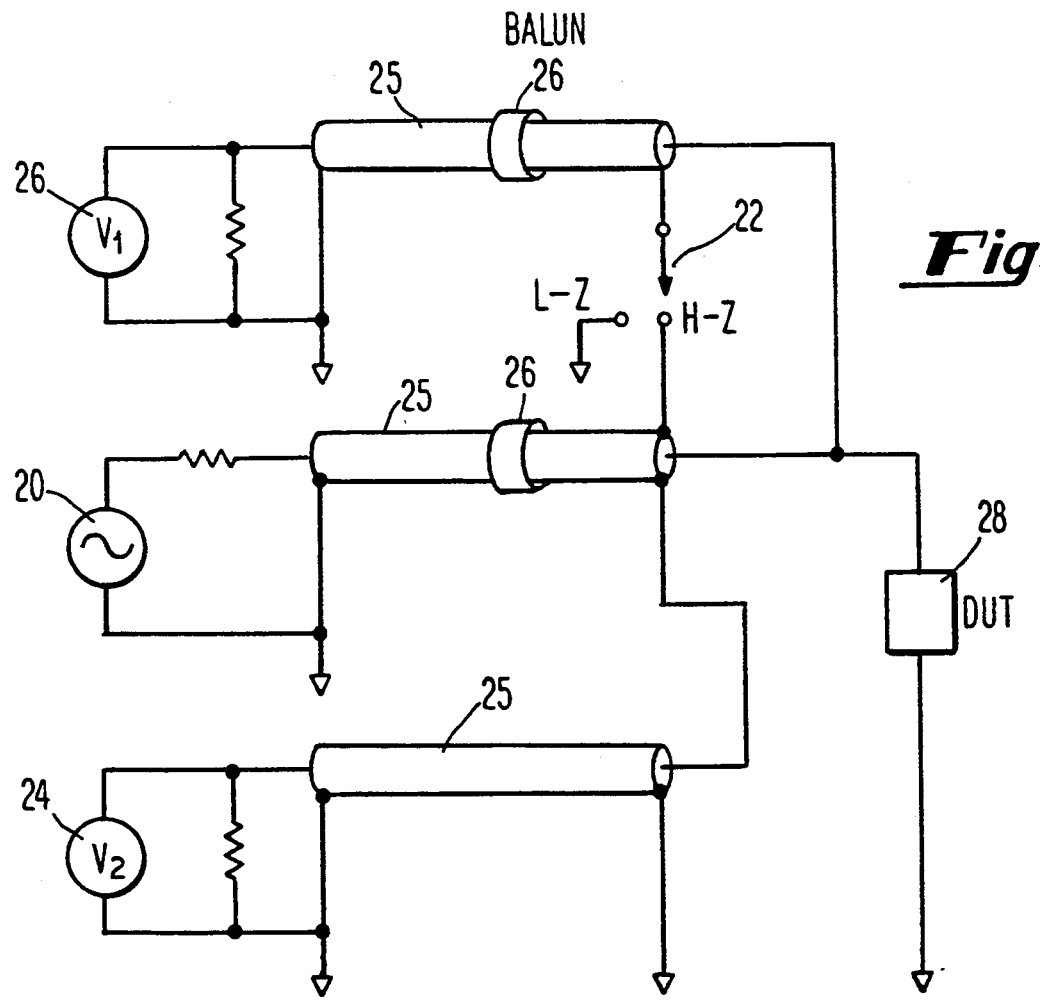
FIG. 12 is a first circuit diagram (A-point grounded type) according to a first arrangement of the FIG. 11 impedance meter.
Figure 13:
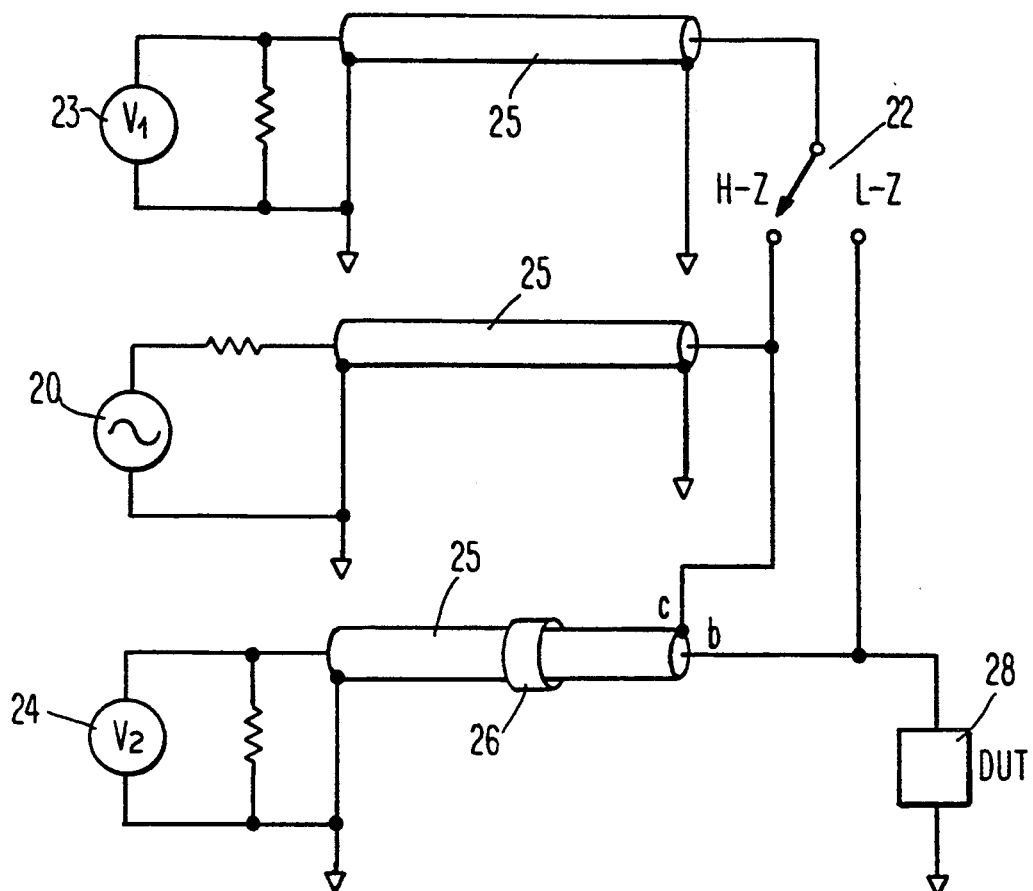
FIG. 13 is a second circuit diagram (B-point grounded type) according to another arrangement of the FIG. 11 impedance meter.

FIG. 11 is first principle circuit diagram of one embodiment of the present invention. FIG. 12 is a first circuit diagram according to an embodiment wherein a point "A" of FIG. 11 is grounded, and FIG. 13 is a second circuit diagram according to an embodiment wherein a point "B" of FIG. 11 is grounded.

Figure 14:
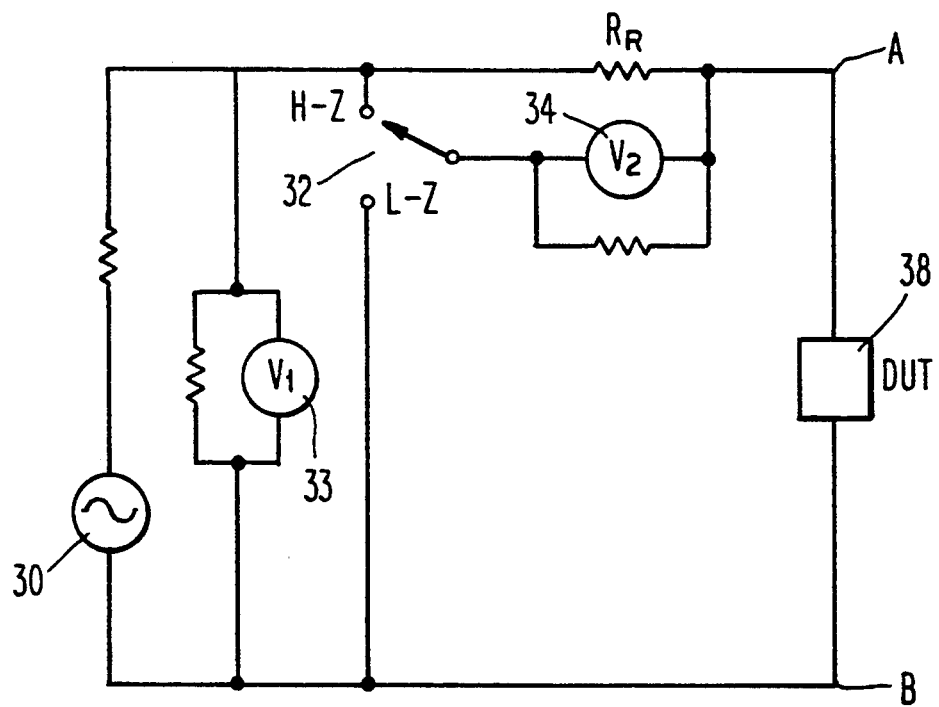
FIG. 14 is a second principle circuit diagram of the present invention.
Figure 15:
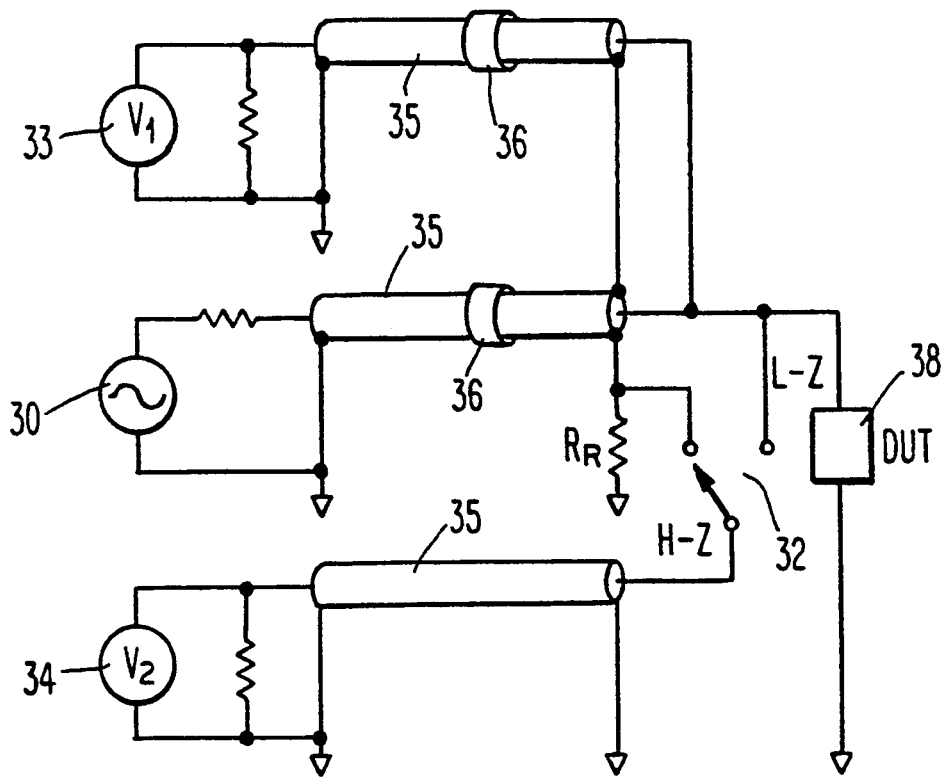
FIG. 15 is a third circuit diagram (A-point grounded type) according to a first arrangement of the FIG. 14 impedance meter.
Figure 16:
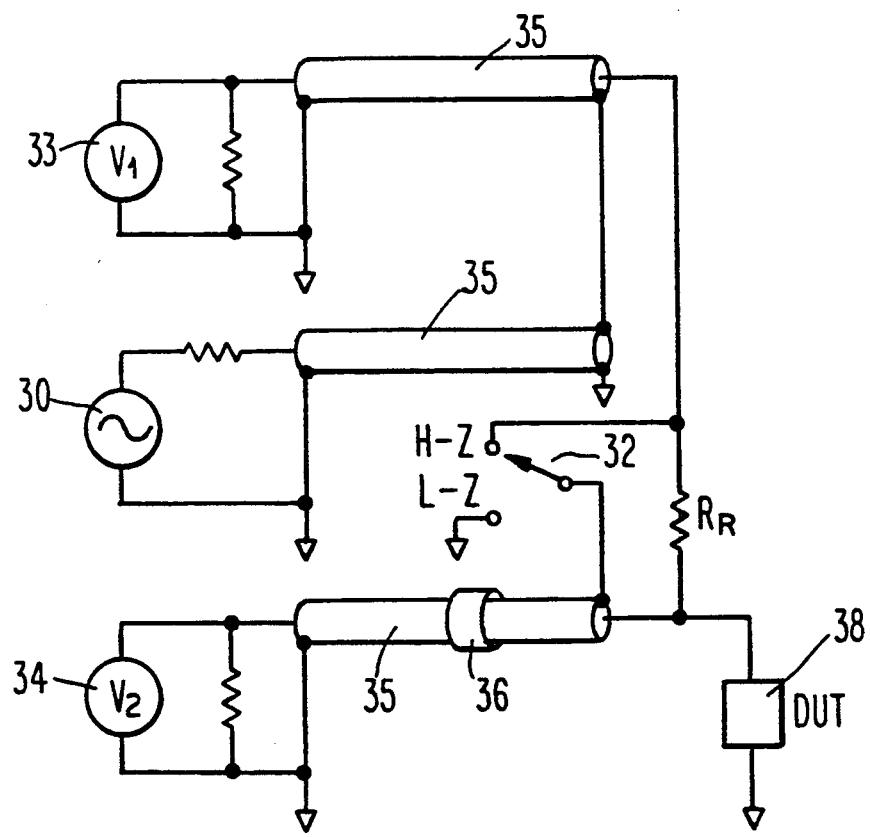
FIG. 16 is a fourth circuit diagram (B-point grounded type) according to another arrangement of the FIG. 14 impedance meter.

FIG. 14 is a second principle circuit diagram of another embodiment of the present invention. FIG. 15 is a third circuit diagram according to an embodiment wherein point "A" of FIG. 14 is grounded, and FIG. 16 is a fourth circuit diagram according to an embodiment wherein point "B" of FIG. 14 is grounded. As described above, an impedance meter according to the present invention may be classified into four basic circuits as represented in FIGS. 12, 13, 15 and 16 based upon the principle ideas shown in FIGS. 11 and 14. In each of these embodiments the measuring impedance range is divided based upon the V-I method, and suitable circuit arrangements are selected in response to the impedance values of the DUT so as to achieve the ideal open and the ideal short circuit. A boundary for selecting two impedances ranges is properly defined on the basis of the characteristic impedance of the extended coaxial cables.

In FIG. 11, reference numeral 20 designates a signal source; reference numeral 22 denotes a selecting switch; reference numeral 23 represents a voltmeter; reference numeral 24 denotes an ammeter; and reference numeral 28 denotes a DUT. The switch 22 is switched to an H-Z side when a high impedance is measured, and to an L-Z side when a low impedance is measured.

In FIG. 14, reference numeral 30 denotes a signal source; reference numeral 32 denotes a switch; reference numeral 38 denotes a DUT, and reference numeral 33 denotes a voltmeter. Instrument 34 becomes an ammeter when switch 32 is connected to the H-Z side, whereas instrument 34 becomes a voltmeter when switch 32 is connected to the L-Z side. A current measurement can be obtained from the difference between the measured voltages of instruments 33 and 34. In the basic circuits of FIGS. 12, 13, 15, and 16, the measuring port is connected with the measuring instrument by extension coaxial cables 25 and 35, and baluns (common mode chokes) 26, 36 are appropriately used.

In a specific example of the invention, the switching unit and the baluns are stored in a small box that constitutes the measuring port provided at tip portions of the extension coaxial cables 25 and 35, whereby DUTs having a broad impedance range may be remotely measured with high precision. The balun is realized by winding a coaxial line on a compact ferrite core or the like in several turns to obtain a floating impedance having several hundreds ohms.

Figure 20:
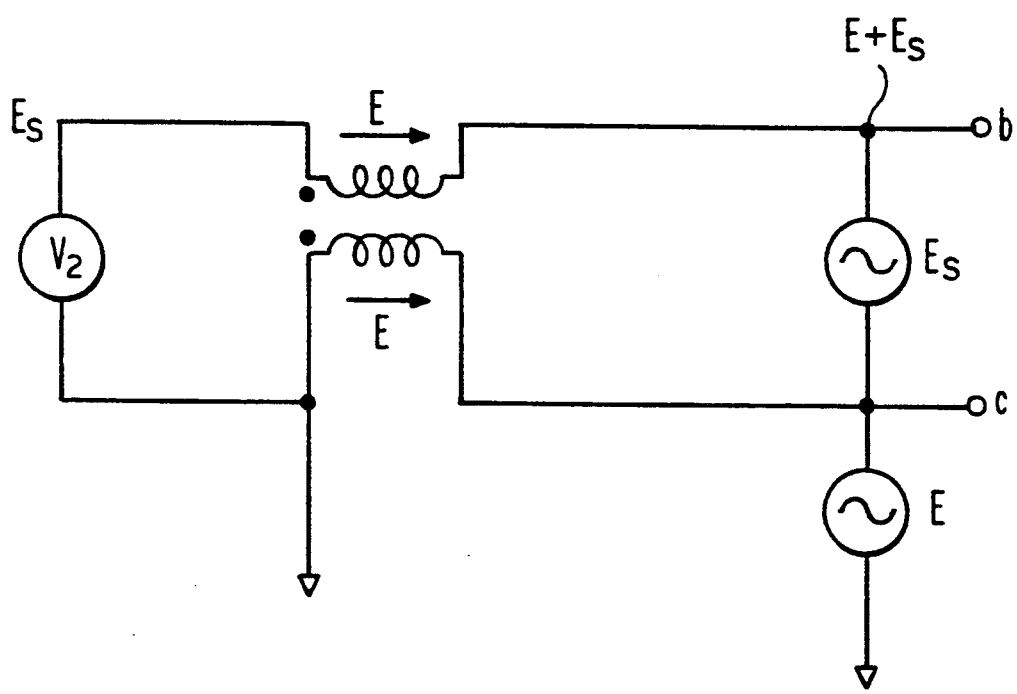
FIG. 20 is a schematic diagram for explaining effects of baluns.

The baluns will now be briefly explained with reference to FIGS. 13 and 20. FIG. 20 is a schematic diagram for explaining the effects of a balun. In FIG. 20, "E" indicates a common mode voltage. In the circuit of FIG. 20: (1) When a voltage Es is applied between the terminals "b" and "c," only a differential voltage Es appears at the measuring instrument $V_2$, but no common mode voltage E appears. (2) The balun has such a characteristic that the common mode impedance as viewed from the terminals "b" and "c" is great, so that it may be seen that the measuring instrument $V_2$ is floating. In other words, it seems that the measuring instrument $V_2$ is present between an inner conductor "b" and an outer conductor "c" of coaxial cable 25.

Differences between the four basic circuits will now be explained.

(1) It makes a difference whether the inner conductor of the coaxial cable is switched or the outer conductor is switched. Depending upon the sorts of switching element and drive circuit thereof, and the mounting method employed, stray admittances and residual impedances may vary, so that the degree to which the ideal open and ideal short circuit are realized may vary.

(2) The impedances as viewed from the measurement port to which the DUT is connected are different in the different embodiments, and the amounts the impedances change when the switches are switched are different.

(3) Although the exciting impedance of the balun is varied in response to temperature, there are differences in the occurrence of errors caused by this impedance variation. The magnetic permeability of, for instance, a ferrite core that constitutes the balun is not stable with respect to magnetization and temperature changes.

(4) In the cases of FIGS. 12 and 15, when the switch is connected to the H-Z side the exciting impedance of the balun is connected in parallel with the ammeter (the exciting impedance of the balun is entered between the outer conductor of the coaxial cable and the reference potential port), whereby a shunt error is produced. In the cases of FIGS. 13 and 16, there is no problem since it is connected in parallel with the signal source, and the voltage thereof is measured by this voltmeter.

(5) The measurement is sometimes required to superimpose a DC bias to the DUT. Therefore, the above-described items (1) to (4) are influenced by the additional DC bias circuit.

Figure 17:
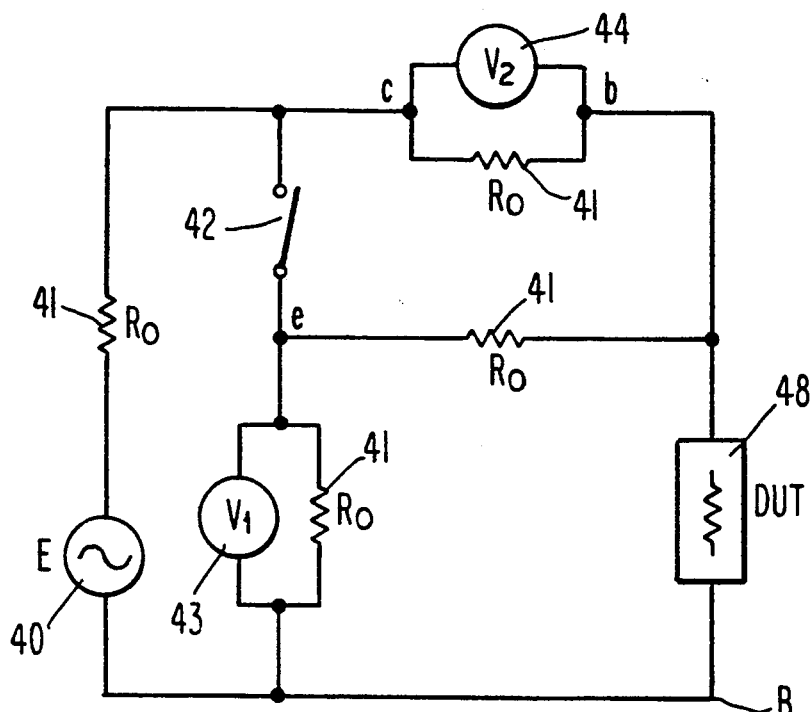
FIG. 17 is a third principle circuit diagram of the present invention.
Figure 18:
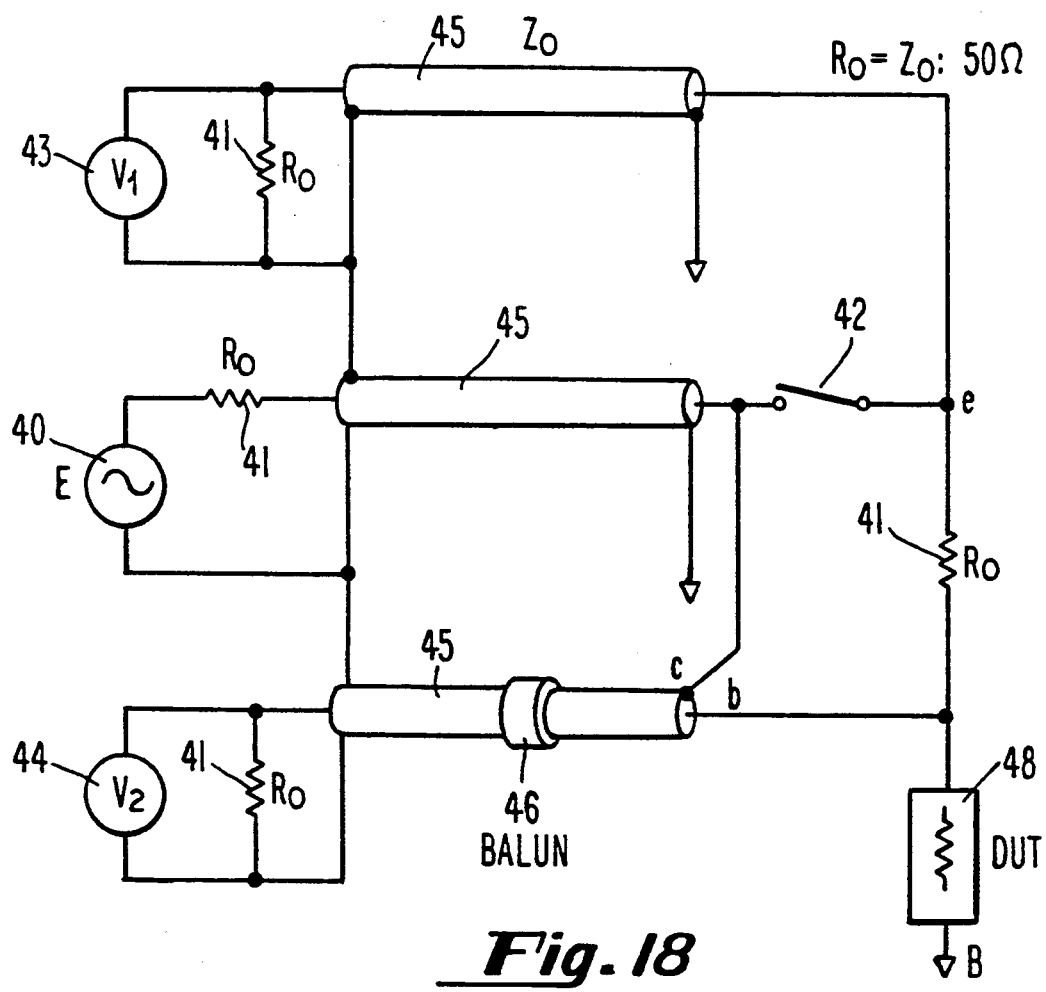
FIG. 18 is a circuit diagram of an impedance meter according to the FIG. 17 principle circuit.

FIG. 17 is a third principle circuit diagram of the present invention. FIG. 18 is a more specific circuit diagram. Reference numeral 40 denotes a signal source; reference numeral 43 denotes a voltmeter; reference numeral 44 denotes an ammeter; reference numeral 45 denotes a coaxial cable between a measuring port extended at a side of a measuring instrument and an impedance under test; reference numeral 46 denotes a balun; and reference numeral 48 denotes a DUT. It is assumed that a relationship between a characteristic impedance $Z_0$ of the coaxial cable 45 and a resistance value $R_0$ of a resistor 41 is $Z_0 = R_0$ (e.g., 50Ω). A switch SW 42 is turned ON during a high impedance measurement and turned OFF during a low impedance measurement. It should be noted that a current is shunted from the signal source by the resistor $R_0$ and, since an amount thereof is previously known, this amount is calibrated. These circuits employ the basic circuit shown in FIG. 13.

These circuits have the following features:

(1) Changes in the exciting impedance of the balun due to temperatures do not cause measurement errors.

(2) The signal source 40, measuring instruments 43, 44 and so on have the impedance $R_0$, and otherwise are connected to $R_0$ as shown in the figure. As a result, there is no change in the excitation voltage of the DUT 48 and the impedance of the measuring port (i.e., the impedance as viewed from the measuring port) due to the switching operations of switch 42. In other words, the measuring port voltage when the DUT is opened corresponds to a half of the voltage E (defined by $R_0$ to $R_0$ or $2R_0$ to $2R_0$) independent of the ON/OFF switching operations of switch 42. The measuring port impedance is equal to $R_0$, i.e., is not changed due to a parallel circuit of $2R_0$ and $2R_0$ or a series circuit of $R_0/2$ and $R_0/2$ as the switch is switched. This characteristic is especially important to the measurement of a DUT having an impedance that depends upon the excitation voltage. This is because no discontinuity occurs in the measurement values as a consequence of selecting the impedance ranges.

(3) The switch having two contacts is simplified by a switch 42 having one contact. Accordingly, switch 42 may be realized by employing a diode and a simple bias circuit, as described below.

Figure 19:
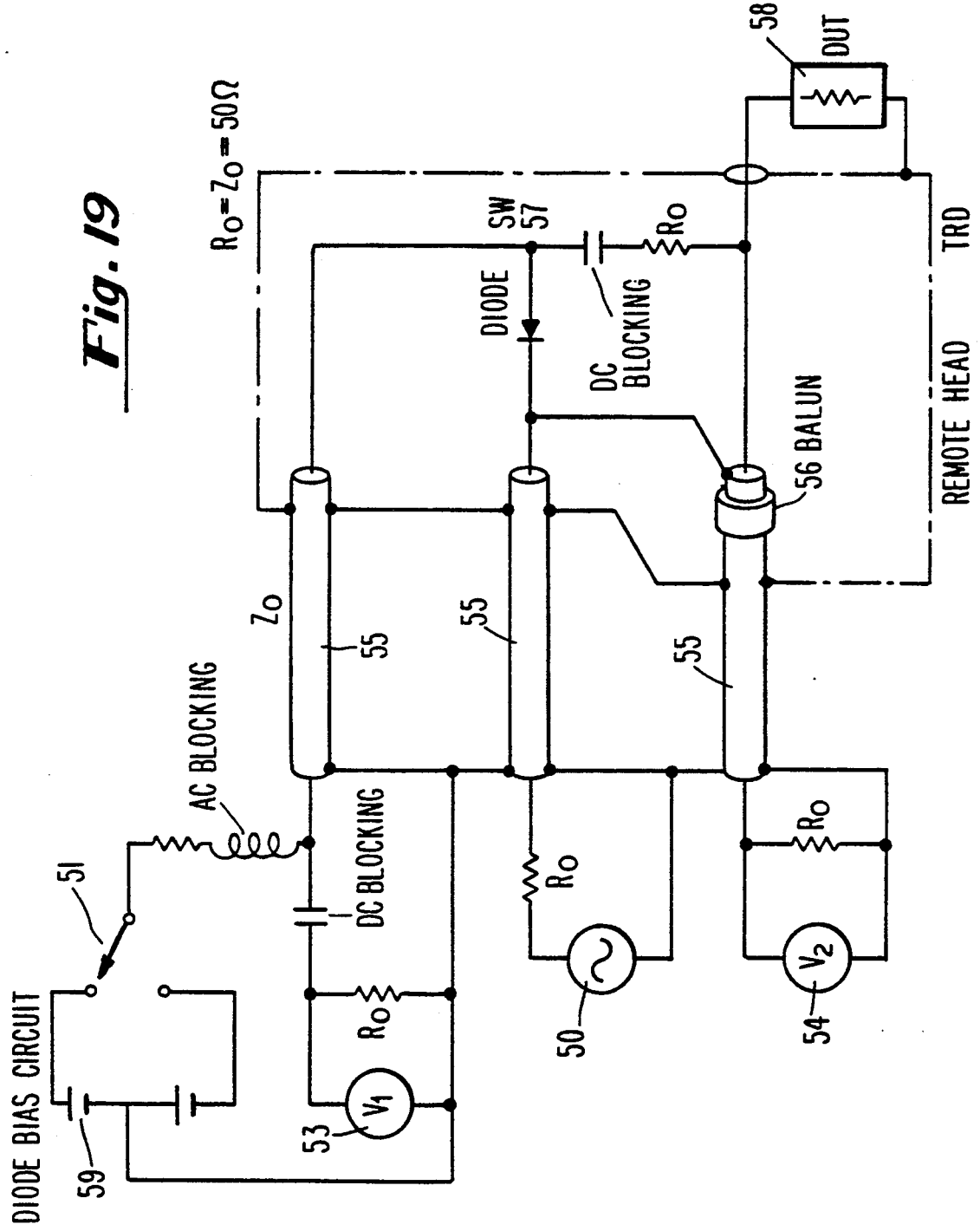
FIG. 19 is a circuit diagram of an impedance meter according to another embodiment of the present invention.

FIG. 19 is a circuit diagram of an impedance meter according to a further embodiment of the present invention. Reference numeral 50 denotes a signal source; reference numeral 53 denotes a voltmeter; reference numeral 54 denotes an ammeter; reference numeral 55 denotes an extension coaxial cable; reference numeral 56 denotes a balun; and reference numeral 58 denotes a DUT. In this case, $Z_0 = R_0 = 50Ω$. A difference between this circuit and the FIG. 18 circuit is that a diode switch 57 is used and a bias circuit 59 therefor is added. Switch 51 is connected to "a" when the high impedance is measured, and is connected to "b" when the low impedance is measured. Tip portions of three coaxial cables 55, balun 56, switch 57, and the measuring port are stored in a single box, and are used as a remote head TRD.

Effects of the present invention may be summarized as follows.

As apparent from this specification, an impedance meter according to the present invention is constructed of two measuring instruments whose measuring terminals have been extended by coaxial cables (the input impedances of these measuring instruments are equal to the characteristic impedances of the coaxial cables); a signal source whose output terminal has similarly been extended by a coaxial cable (the output impedance is equal to the characteristic impedance of the coaxial cable); and a TRD provided at tip portions of the coaxial cables. A practical impedance meter with a frequency band from 1 MHz to 2 GHz and capable of measuring DUTs over a broad impedance range at high precision can be realized.

The reasons why the impedance can be measured at higher precision than that of conventional apparatus can be summarized as follows:

(1) When the high impedance is measured, the circuit to achieve the ideal open is selected, and when the low impedance is measured, the circuit to achieve the ideal short circuit is selected, whereby impedance measurements at high precision over a broad impedance range can be performed.

(2) The TRD may be realized by using a small number of parts, and may be arranged as a pencil-shaped compact probe (remote head). The head, signal source, and measuring instruments are connected to each other via coaxial cables having the characteristic impedance. Thus, remote measurements can be obtained over a broad impedance range.

(3) Since the above-described half-division impedance selecting operation is performed, the current transformer whose winding ratio is multi-winding-to-1 and which is used in the conventional V-I method is no longer required, resulting in improvements of the temperature characteristic, frequency band characteristic and measured S/N.

What is claimed is:

1. An impedance meter, comprising:
   (a) a signal source comprising means for exciting a device under test (DUT);
   (b) a first measuring instrument for measuring a first voltage indicative of a voltage drop across said DUT;
   (c) a second measuring instrument for measuring a second voltage indicative of a current through said DUT; and
   (d) switching means for switching the interconnection of said signal source and said first and second measuring instruments between an ideal open type circuit and an ideal short circuit type circuit in response to a DUT impedance determined on the basis on said first and second voltages, said ideal open and ideal short circuit type circuits being pre-defined circuit configurations;
   wherein the DUT impedance is a function of at least said first and second voltages.

2. An impedance meter according to claim 1, wherein the DUT, said signal source, and said first and second measuring instruments are connected with each other via coaxial cables having a characteristic impedance $Z_0$, and internal impedances of said signal source and said measuring instruments are approximately equal to $Z_0$.

3. An impedance meter according to claim 2, further comprising a balun associated with at least one of said coaxial cables, said balun preventing at least one of said measuring instruments from receiving a common mode voltage associated with said source.

4. An impedance meter according to claim 2, wherein said first measuring instrument comprises a voltmeter arranged to measure a voltage between an inner and an outer conductor of a first coaxial cable; said second measuring instrument comprises a voltmeter arranged to measure a voltage between an inner and an outer conductive of a second coaxial cable; and said signal source is arranged to apply a voltage across an inner and an outer conductor of a third coaxial cable; said first, second and third coaxial cables being operatively coupled to said DUT.

5. An impedance meter according to claim 4, wherein said switching means comprises means for connecting the outer conductor of said first cable to the outer conductor of said third cable in response to a high DUT impedance, and for connecting the outer conductor of said first cable to a common potential in response to a low DUT impedance.

6. An impedance meter according to claim 4, wherein said switching means comprises means for connecting the inner conductor of said first cable to the inner conductor of said third cable and outer conductor of said second cable in response to a high DUT impedance, and for connecting the inner conductor of said first cable to the inner conductor of said second cable in response to a low DUT impedance.

7. An impedance meter according to claim 4, wherein said switching means comprises means for connecting the inner conductor of said second cable to the outer conductors of said first and third cables in response to a high DUT impedance, and for connecting the inner conductor of said second cable to the inner conductors of said first and third cables in response to a low DUT impedance.

8. An impedance meter according to claim 4, wherein said switching means comprises means for connecting the outer conductor of said second cable to the inner conductor of said first cable in response to a high DUT impedance, and for connecting the outer conductor of said second cable to a common potential in response to a low DUT impedance.

9. An impedance meter according to claim 4, wherein said switching means comprises means for selectively connecting the inner conductor of said first cable to the inner conductor of said third cable and the outer conductor of said second cable.

10. An impedance meter according to claim 4, wherein said switching means comprises a diode switch coupled between said first, second, and third coaxial cables.

11. An impedance meter according to claim 4, wherein said balun and said switching means are arranged within a single housing and are remote from said signal source and said measuring instruments.

12. A method for measuring an impedance of a device under test (DUT), wherein the DUT is operatively interconnected with first and second voltage measuring instruments and a signal source, comprising the steps of:
   (a) exciting a DUT with a signal source;
   (b) measuring, with a first measuring instrument, a first voltage indicative of a voltage drop across said DUT;
   (c) measuring, with a second measuring instrument, a second voltage indicative of a current through said DUT;
   (d) determining a DUT impedance on the basis of said first and second voltages; and
   (e) switching the interconnection of said signal source and said first and second measuring instruments between an ideal open type circuit and an ideal short circuit type circuit in response to the DUT impedance determined on the basis on said first and second voltages, said ideal open and ideal short circuit type circuits being predefined circuit configurations;
   wherein the DUT impedance is a function of at least said first and second voltages.

13. A method of measuring an impedance of a DUT according to claim 12, comprising the step of connecting a measuring port to which the DUT is connected, said signal source, and said first and second measuring instruments with each other via coaxial cables having a characteristic impedance $Z_0$, wherein internal impedances of said signal source and said measuring instruments are approximately equal to $Z_0$.

14. A method for measuring an impedance of a DUT according to claim 13, comprising the steps of coupling first, second and third coaxial cables to said DUT; arranging said first measuring instrument to measure a voltage between an inner and an outer conductor of said first coaxial cable; arranging said second measuring instrument to measure a voltage between an inner and an outer conductor of said second coaxial cable; and arranging said signal source to apply a voltage across an inner and an outer conductor of said third coaxial cable.

15. A method for measuring an impedance of a DUT according to claim 14, wherein said switching step (e) comprises connecting the outer conductor of said first cable to the outer conductor of said third cable in response to a high DUT impedance, and connecting the outer conductor of said first cable to a common potential in response to a low DUT impedance.

16. A method for measuring an impedance of a DUT according to claim 14, wherein said switching step comprises connecting the inner conductor of said first cable to the inner conductor of said third cable and outer conductor of said second cable in response to a high DUT impedance, and connecting the inner conductor of said first cable to the inner conductor of said second cable in response to a low DUT impedance.

17. A method for measuring an impedance of a DUT according to claim 14, wherein said switching step comprises connecting the inner conductor of said second cable to the outer conductors of said first and third cables in response to a high DUT impedance, and connecting the inner conductor of said second cable to the inner conductors of said first and third cables in response to a low DUT impedance.

18. A method for measuring an impedance of a DUT according to claim 14, wherein said switching step comprises connecting the outer conductor of said second cable to the inner conductor of said first cable in response to a high DUT impedance, and connecting the outer conductor of said second cable to a common potential in response to a low DUT impedance.

19. A method for measuring an impedance of a DUT according to claim 14, wherein said switching step comprises selectively connecting the inner conductor of said first cable to the inner conductor of said third cable and the outer conductor of said second cable.

* * * * *